United States Patent
Rofougaran

(10) Patent No.: US 8,170,142 B2
(45) Date of Patent: May 1, 2012

(54) PROGRAMMABLE HYBRID TRANSMIT BASEBAND MODULE

(75) Inventor: Ahmadreza (Reza) Rofougaran, Newport Coast, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 12/943,883

(22) Filed: Nov. 10, 2010

(65) Prior Publication Data

US 2011/0051844 A1 Mar. 3, 2011

Related U.S. Application Data

(63) Continuation of application No. 11/494,682, filed on Jul. 26, 2006, now Pat. No. 7,852,970, which is a continuation-in-part of application No. 11/388,822, filed on Mar. 24, 2006, now Pat. No. 7,787,547.

(51) Int. Cl.
  *H03C 3/00* (2006.01)
(52) U.S. Cl. ............................................ 375/302
(58) Field of Classification Search .................. 375/295, 375/298, 377, 302
  See application file for complete search history.

(56) References Cited

U.S. PATENT DOCUMENTS

| 3,921,163 | A  | * | 11/1975 | Giraud et al. | 345/22 |
|---|---|---|---|---|---|
| 6,091,765 | A  | * | 7/2000 | Pietzold et al. | 375/219 |
| 7,421,037 | B2 | * | 9/2008 | Shakeshaft et al. | 375/295 |
| 7,532,679 | B2 | * | 5/2009 | Staszewski et al. | 375/295 |
| 7,596,184 | B2 | * | 9/2009 | Ahmed | 375/296 |
| 7,599,448 | B2 | * | 10/2009 | Ahmed et al. | 375/300 |
| 2003/0073419 | A1 | * | 4/2003 | Chadwick | 455/126 |
| 2005/0191976 | A1 | * | 9/2005 | Shakeshaft et al. | 455/118 |
| 2006/0038710 | A1 | * | 2/2006 | Staszewski et al. | 341/143 |
| 2007/0021078 | A1 | * | 1/2007 | Boos | 455/126 |

* cited by examiner

*Primary Examiner* — Jaison Joseph
(74) *Attorney, Agent, or Firm* — Garlick & Markison; Timothy W. Markison; Jessica W. Smith

(57) ABSTRACT

A programmable hybrid transmit baseband module includes a wireless protocol conversion module, a set of modules, and a mode select module. The wireless protocol conversion module is operable to convert outbound data into a complex signal having an in-phase (I) signal component and a quadrature (Q) signal component. The set of modules is operable to generate an offset adjusted normalized I signal component, an offset adjusted normalized Q signal component, and corrected amplitude modulation data, wherein each of the normalized I and Q signal components includes phase modulation data. The mode selection module is operable to output the I and Q signal components when the programmable hybrid transmit baseband module is in a first mode; and output the offset adjusted normalized I and Q signal components and the corrected amplitude modulation data when the programmable hybrid transmit baseband module is in a second mode.

20 Claims, 8 Drawing Sheets

PROGRAMMABLE HYBRID TRANSMIT BASEBAND MODULE

CROSS REFERENCE TO RELATED PATENTS

This patent application is claiming priority under 35 USC §120 as a continuing patent application of co-pending patent application entitled PROGRAMMABLE HYBRID TRANSMITTER, having a filing date of Jul. 26, 2006, and a Ser. No. 11/494,682, which is incorporated herein by reference.

The patent application Ser. No. 11/494,682 claims priority under 35 USC §120 as a continuation-in-part of issued patent entitled HYBRID RADIO FREQUENCY TRANSMITTER, having a filing date of Mar. 24, 2006, a Ser. No. 11/388,822, and a U.S. Pat. No. 7,787,547.

STATEMENT REGARDING FEDERALLY SPONSORED RESEARCH OR DEVELOPMENT

NOT APPLICABLE

INCORPORATION-BY-REFERENCE OF MATERIAL SUBMITTED ON A COMPACT DISC

NOT APPLICABLE

BACKGROUND OF THE INVENTION

1. Technical Field of the Invention

This invention relates generally to communication systems and more particularly to radio frequency transmitters used in such communication systems.

2. Description of Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), radio frequency identification (RFID), and/or variations thereof.

Depending on the type of wireless communication system, a wireless communication device, such as a cellular telephone, two-way radio, personal digital assistant (PDA), personal computer (PC), laptop computer, home entertainment equipment, RFID reader, RFID tag, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system or a particular RF frequency for some systems) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the receiver is coupled to the antenna and includes a low noise amplifier, one or more intermediate frequency stages, a filtering stage, and a data recovery stage. The low noise amplifier receives inbound RF signals via the antenna and amplifies then. The one or more intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard.

As is also known, the transmitter includes a data modulation stage, one or more intermediate frequency stages, and a power amplifier. The data modulation stage converts raw data into baseband signals in accordance with a particular wireless communication standard. The one or more intermediate frequency stages mix the baseband signals with one or more local oscillations to produce RF signals. The power amplifier amplifies the RF signals prior to transmission via an antenna.

Currently, there are two basic types of RF transmitters: Cartesian based transmitter and a Polar coordinate based transmitter. A Cartesian based transmitter includes baseband processing and RF transmission circuitry. The baseband processing encodes, punctures, maps, interleaves, and domain converts outbound data into an in-phase (I) signal component and a quadrature (Q) signal component. For example, if the baseband processing utilizes a 64 quadrature amplitude modulation (QAM) scheme, a first outbound data value of 101 may be ½ rate encoded into a value of 11 10 01 and a second outbound data value of 011 may be ½ rate encoded into a value of 00 11 01. After puncturing, the encoded values may be interleaved to produce a first interleaved value of 10 11 01 and a second interleaved value of 01 10 01. The first interleaved value is mapped into an I value of 101 and a Q value of 101 and the second interleaved value is mapped into an I value of 011 and a Q value of 001. Each pair of mapped I and Q interleaved values are converted into time domain signals via an inverse fast Fourier transform (IFFT) for a corresponding sub carrier of the signaling protocol (e.g., orthogonal frequency division multiplexing [OFDM]). The time domain I and Q signals are converted into analog signals via an analog to digital converter to produce the I signal component and the Q signal component.

The RF transmission circuitry includes a local oscillator, a mixing section, a linear power amplifier, and may include RF filtering. For direct conversion transmitters, the local oscillator generates an I local oscillation and a Q local oscillation, which are respectively mixed with the I signal component and the Q signal component via the mixing section. The resulting I mixed signal and Q mixed signal are summed to produce an RF signal. The linear power amplifier amplifies to the RF signal to produce an amplified RF signal that may be subsequently bandpass filtered prior to transmission.

While a Cartesian based RF transmitter provides the advantage of a single side band transmitter (i.e., do not have negative frequencies with I and Q signals), the transmitter path (i.e., the mixing section and the power amplifier) needs to be linear to avoid loss of data resolution. Such linearity requirement limits the output power of the power amplifier.

A Polar coordinate based transmitter includes baseband processing and RF transmission circuitry. The baseband processing encodes, punctures, maps, interleaves, and domain converts outbound data into polar coordinates of an amplitude (A) and a phase ($\Phi$). For example, if the baseband processing utilizes a 64 quadrature amplitude modulation (QAM) scheme, an a first outbound data value of 101 may be ½ rate encoded into a value of 11 10 01 and a second outbound data value of 011 may be ½ rate encoded into a value of 00 11 01. After puncturing, the encoded values may be interleaved to produce a first interleaved value of 10 11 01 and a second interleaved value of 01 10 01. The first interleaved value is mapped into an amplitude value of $A_0$ and a phase value of $\Phi_0$ and the second interleaved value is mapped into an amplitude value of $A_1$ and a phase value of $\Phi_1$.

The RF transmission circuitry includes a local oscillator and a power amplifier. The local oscillator includes a phase locked loop (PLL) that generates a local oscillation at a desired RF frequency that is modulated based on phase values $\Phi_0$ and $\Phi_1$. The phase modulated RF signal is then amplitude modulated by the power amplifier in accordance with the amplitude values $A_0$ and $A_1$ to produce a phase and amplitude modulated RF signal.

While the Polar coordinate RF transmitter provides the advantages of reduced RF filtering due to the response of the PLL and the use of a non-linear power amplifier (which, for the same die area, is capable of greater output power than a linear power amplifier), there are some disadvantages. For instance, the response of the PLL is narrow, thus limiting the RF transmitter to narrow band uses. Further, maintaining synchronization between the phase values and the amplitude values can be difficult due to the delays within the PLL. Still further, the baseband processing is utilizing real signals, thus has to account for potential negative frequencies.

Therefore, a need exists for a transmitter that provides the advantages of a Cartesian RF transmitter and a Polar coordinate transmitter without some or all of the disadvantaged associated therewith.

BRIEF SUMMARY OF THE INVENTION

The present invention is directed to apparatus and methods of operation that are further described in the following Brief Description of the Drawings, the Detailed Description of the Invention, and the claims. Other features and advantages of the present invention will become apparent from the following detailed description of the invention made with reference to the accompanying drawings.

BRIEF DESCRIPTION OF THE SEVERAL VIEWS OF THE DRAWING(S)

DETAILED DESCRIPTION OF THE INVENTION

Figure 1:
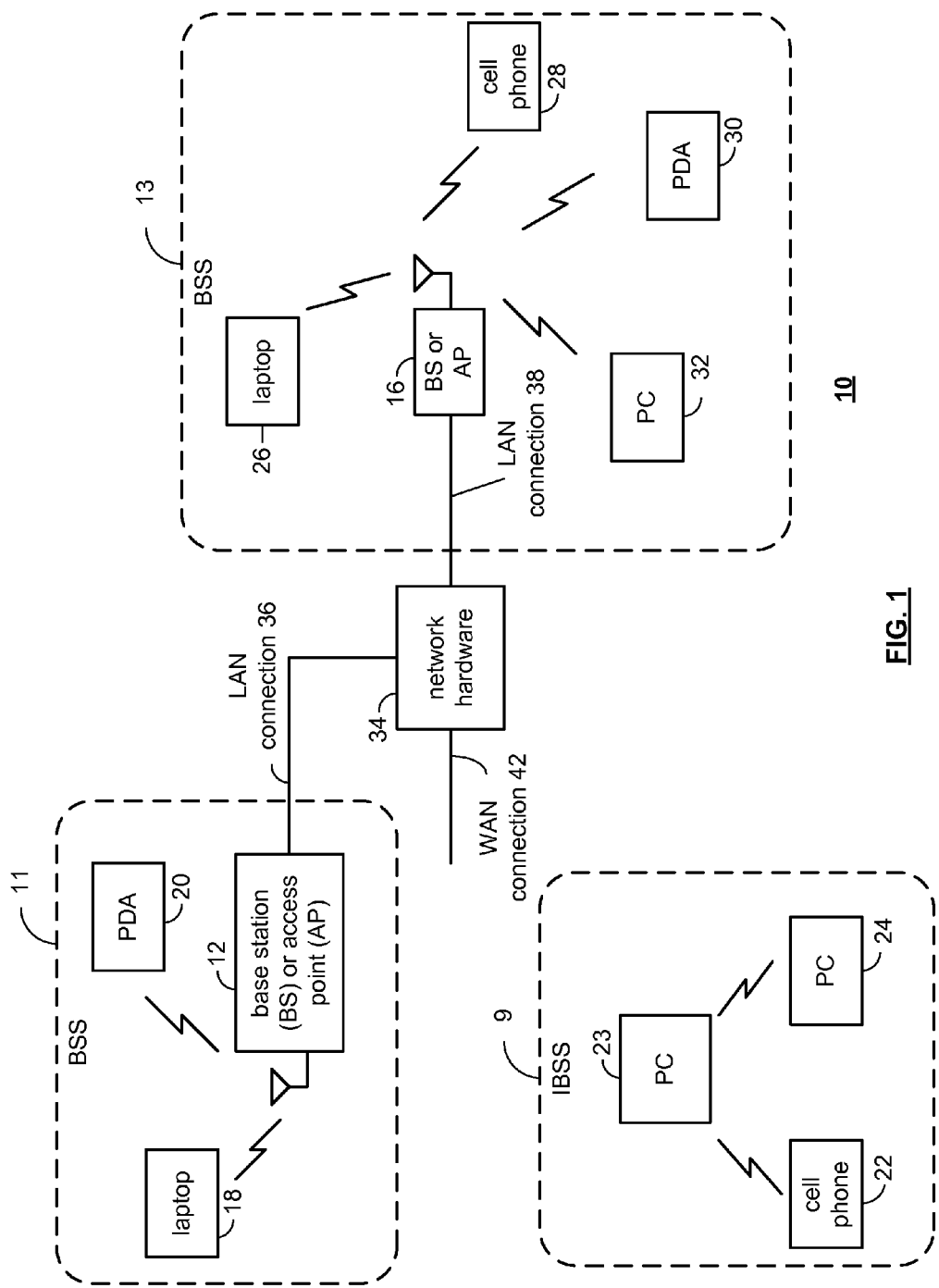
FIG. 1 is a schematic block diagram of a communication system in accordance with the present invention.

FIG. 1 is a schematic block diagram illustrating a communication system 10 that includes a plurality of base stations and/or access points 12, 16, a plurality of wireless communication devices 18-32 and a network hardware component 34. Note that the network hardware 34, which may be a router, switch, bridge, modem, system controller, et cetera, provides a wide area network connection 42 for the communication system 10. Further note that the wireless communication devices 18-32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 2.

Wireless communication devices 22, 23, and 24 are located within an independent basic service set (IBSS) area and communicate directly (i.e., point to point). In this configuration, these devices 22, 23, and 24 may only communicate with each other. To communicate with other wireless communication devices within the system 10 or to communicate outside of the system 10, the devices 22, 23, and/or 24 need to affiliate with one of the base stations or access points 12 or 16.

The base stations or access points 12, 16 are located within basic service set (BSS) areas 11 and 13, respectively, and are operably coupled to the network hardware 34 via local area network connections 36, 38. Such a connection provides the base station or access point 12 16 with connectivity to other devices within the system 10 and provides connectivity to other networks via the WAN connection 42. To communicate with the wireless communication devices within its BSS 11 or 13, each of the base stations or access points 12-16 has an associated antenna or antenna array. For instance, base station or access point 12 wirelessly communicates with wireless communication devices 18 and 20 while base station or access point 16 wirelessly communicates with wireless communication devices 26-32. Typically, the wireless communication devices register with a particular base station or access point 12, 16 to receive services from the communication system 10.

Typically, base stations are used for cellular telephone systems and like-type systems, while access points are used for in-home or in-building wireless networks (e.g., IEEE 802.11 and versions thereof, Bluetooth, RFID, and/or any other type of radio frequency based network protocol).

Regardless of the particular type of communication system, each wireless communication device includes a built-in radio and/or is coupled to a radio. Note that one or more of the wireless communication devices may include an RFID reader and/or an RFID tag.

Figure 2:
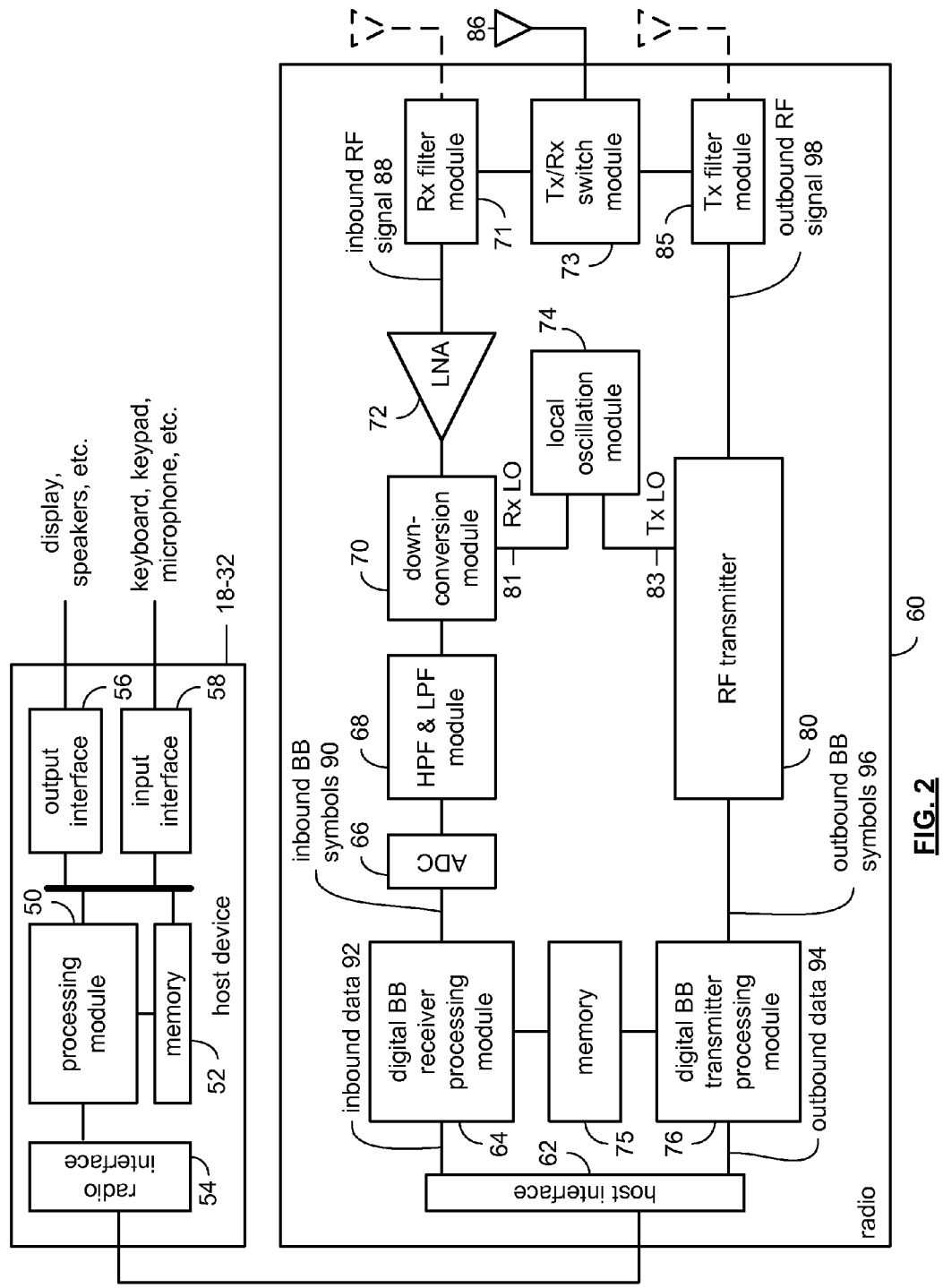
FIG. 2 is a schematic block diagram of an embodiment of a wireless communication device in accordance with the present invention.

FIG. 2 is a schematic block diagram illustrating a wireless communication device that includes the host device 18-32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18-32 includes a processing module 50, memory 52, a radio interface 54, an input interface 58, and an output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, et cetera such that the received data may be displayed. The radio interface 54 also provides data from the processing module 50 to the radio 60. The processing module 50 may receive the outbound data from an input device such as a keyboard, keypad, microphone, et cetera via the input interface 58 or generate the data itself. For data received via the input interface 58, the processing module 50 may perform a corresponding host function on the data and/or route it to the radio 60 via the radio interface 54.

Radio 60 includes a host interface 62, a local oscillation module 74, memory 75, a receiver path, an RF transmitter path 80, and a transmit/receive switch module 71, which is coupled to antenna 86. The receiver path includes a receiver filter 71, a low noise amplifier 72, a down conversion module 70, a high pass and/or low pass filter module 68, an analog-to-digital converter 66, and a digital receiver processing module 64. The RF transmitter path 80 may include a digital transmitter processing module 76, a digital-to-analog converter, a filtering/gain module, an up conversion module, a power amplifier, and/or a transmitter filter module. The RF transmitter 80 will be described in greater detail with reference to FIGS. 4-8. The antenna 86 may be a single antenna that is shared by the transmit and receive paths as regulated by the Tx/Rx switch 73, or may include separate antennas for the transmit path and receive path. The antenna implementation will depend on the particular standard to which the wireless communication device is compliant.

The digital receiver processing module 64 and the digital transmitter processing module 76, in combination with operational instructions stored in memory 75, execute digital receiver functions and digital transmitter functions, respectively. The digital receiver functions include, but are not limited to, digital intermediate frequency to baseband conversion, demodulation, demapping, depuncturing, decoding, and/or descrambling. The digital transmitter functions include, but are not limited to, scrambling, encoding, puncturing, mapping, modulation, and/or digital baseband to IF conversion. The digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 64 and/or 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 60 receives outbound data 94 from the host device via the host interface 62. The host interface 62 routes the outbound data 94 to the digital transmitter processing module 76, which processes the outbound data 94 in accordance with a particular wireless communication standard (e.g., IEEE 802.11, Bluetooth, RFID, WCDMA, EDGE, GSM, et cetera) to produce outbound baseband symbols 96. The outbound baseband symbols 96 will be digital base-band symbols (e.g., have a zero IF) or a digital low IF symbols, where the low IF typically will be in the frequency range of one hundred kilohertz to a few megahertz. Further processing of the outbound baseband signals 96 will be described with respect to one or more of FIGS. 4-11.

In general, the digital-to-analog converter converts the outbound baseband signals 96 from the digital domain to the analog domain. The filtering/gain module filters and/or adjusts the gain of the analog signals prior to providing it to the up-conversion mixing module. The up conversion mixing module, as will be subsequently described, converts the analog baseband or low IF signals into RF signals based on a transmitter local oscillation 83 provided by local oscillation module 74. The power amplifier amplifies the RF signals to produce outbound RF signals 98, which are filtered by the transmitter filter module. The antenna 86 transmits the outbound RF signals 98 to a targeted device such as a base station, an access point and/or another wireless communication device.

The radio 60 also receives inbound RF signals 88 via the antenna 86, which were transmitted by a base station, an access point, or another wireless communication device. The antenna 86 provides the inbound RF signals 88 to the receiver filter module 71 via the Tx/Rx switch 73, where the Rx filter 71 bandpass filters the inbound RF signals 88. The Rx filter 71 provides the filtered RF signals to low noise amplifier 72, which amplifies the signals 88 to produce an amplified inbound RF signals. The low noise amplifier 72 provides the amplified inbound RF signals to the down conversion mixing module 70, which converts the amplified inbound RF signals into an inbound low IF signals or baseband signals based on a receiver local oscillation 81 provided by local oscillation module 74. The down conversion module 70 provides the inbound low IF signals or baseband signals to the filtering/gain module 68. The high pass and low pass filter module 68 filters the inbound low IF signals or the inbound baseband signals to produce filtered inbound signals.

The analog-to-digital converter 66 converts the filtered inbound signals from the analog domain to the digital domain to produce inbound baseband signals 90, where the inbound baseband symbols 90 will be digital base-band symbols or digital low IF symbols, where the low IF typically will be in the frequency range of one hundred kilohertz to a few megahertz. The digital receiver processing module 64 decodes, descrambles, demaps, and/or demodulates the inbound baseband symbols 90 to recapture inbound data 92 in accordance with the particular wireless communication standard being implemented by radio 60. The host interface 62 provides the recaptured inbound data 92 to the host device 18-32 via the radio interface 54.

As one of average skill in the art will appreciate, the wireless communication device of FIG. 2 may be implemented using one or more integrated circuits. For example, the host device may be implemented on one integrated circuit, the digital receiver processing module 64, the digital transmitter processing module 76 and memory 75 may be implemented on a second integrated circuit, and the remaining components of the radio 60, less the antenna 86, may be implemented on a third integrated circuit. As an alternate example, the radio 60 may be implemented on a single integrated circuit. As yet another example, the processing module 50 of the host device and the digital receiver and transmitter processing modules 64 and 76 may be a common processing device implemented on a single integrated circuit. Further, the memory 52 and memory 75 may be implemented on a single integrated circuit and/or on the same integrated circuit as the common processing modules of processing module 50 and the digital receiver and transmitter processing module 64 and 76.

Figure 3:
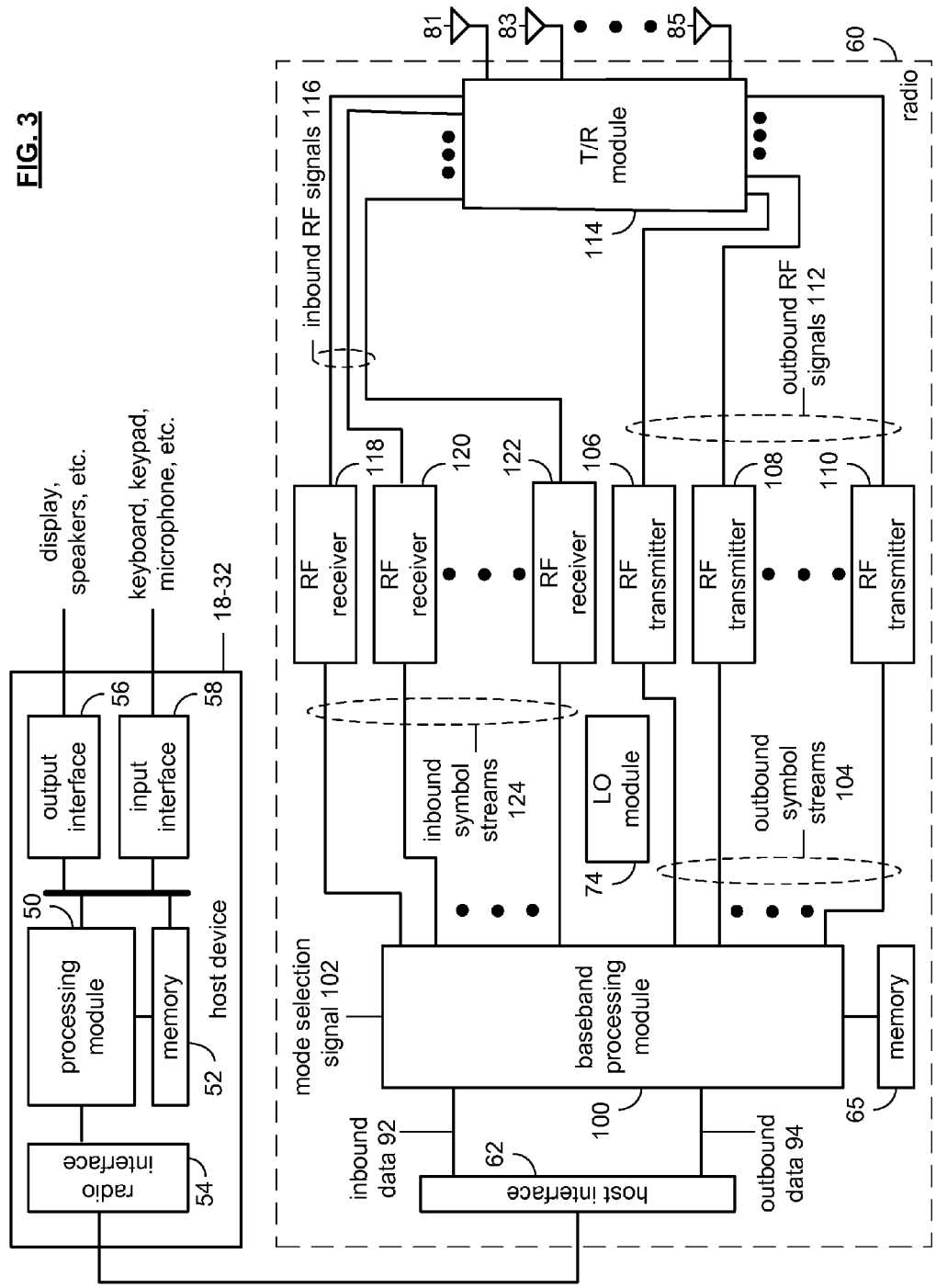
FIG. 3 is a schematic block diagram of another embodiment of a wireless communication device in accordance with the present invention.

FIG. 3 is a schematic block diagram illustrating a wireless communication device that includes the host device 18-32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18-32 includes a processing module 50, memory 52, radio interface 54, input interface 58 and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, et cetera such that the received data may be displayed. The radio interface 54 also provides data from the processing module 50 to the radio 60. The processing module 50 may receive the outbound data from an input device such as a keyboard, keypad, microphone, et cetera via the input interface 58 or generate the data itself. For data received via the input interface 58, the processing module 50 may perform a corresponding host function on the data and/or route it to the radio 60 via the radio interface 54.

Radio 60 includes a host interface 62, memory 64, a receiver path, a transmit path, a local oscillation module 74, and a transmit/receive module 114, which is coupled to a plurality of antennas 81-85. The receive path includes a baseband processing module 100 and a plurality of RF receivers 118-120. The transmit path includes baseband processing module 100 and a plurality of radio frequency (RF) transmitters 106-110. The baseband processing module 100, in combination with operational instructions stored in memory 65 and/or internally operational instructions, executes digital receiver functions and digital transmitter functions, respectively. The digital receiver functions include, but are not limited to, digital intermediate frequency to baseband conversion, demodulation, constellation demapping, depuncturing, decoding, de-interleaving, fast Fourier transform, cyclic prefix removal, space and time decoding, and/or descrambling. The digital transmitter functions include, but are not limited to, scrambling, encoding, puncturing, interleaving, constellation mapping, modulation, inverse fast Fourier transform, cyclic prefix addition, space and time encoding, and digital baseband to IF conversion. The baseband processing modules 100 may be implemented using one or more processing devices. Such a processing device may be a microprocessor, microcontroller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 65 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 100 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 60 receives outbound data 94 from the host device via the host interface 62. The baseband processing module 64 receives the outbound data 88 and, based on a mode selection signal 102, produces one or more outbound symbol streams 90. The mode selection signal 102 will indicate a particular mode of operation that is compliant with one or more specific modes of the various IEEE 802.11, RFID, WCDMA, EDGE, GSM etc., standards. For example, the mode selection signal 102 may indicate a frequency band of 2.4 GHz, a channel bandwidth of 20 or 22 MHz and a maximum bit rate of 54 megabits-per-second. In this general category, the mode selection signal will further indicate a particular rate ranging from 1 megabit-per-second to 54 megabits-per-second. In addition, the mode selection signal will indicate a particular type of modulation, which includes, but is not limited to, Barker Code Modulation, BPSK, QPSK, CCK, 16 QAM and/or 64 QAM. The mode select signal 102 may also include a code rate, a number of coded bits per subcarrier (NBPSC), coded bits per OFDM symbol (NCBPS), and/or data bits per OFDM symbol (NDBPS). The mode selection signal 102 may also indicate a particular channelization for the corresponding mode that provides a channel number and corresponding center frequency. The mode select signal 102 may further indicate a power spectral density mask value and a number of antennas to be initially used for a MIMO communication.

The baseband processing module 100, based on the mode selection signal 102 produces one or more outbound symbol streams 104 from the outbound data 94. For example, if the mode selection signal 102 indicates that a single transmit antenna is being utilized for the particular mode that has been selected, the baseband processing module 100 will produce a single outbound symbol stream 104. Alternatively, if the mode select signal 102 indicates 2, 3 or 4 antennas, the baseband processing module 100 will produce 2, 3 or 4 outbound symbol streams 104 from the outbound data 94.

Depending on the number of outbound streams 104 produced by the baseband module 10, a corresponding number of the RF transmitters 106-110 will be enabled to convert the outbound symbol streams 104 into outbound RF signals 112. Each of the RF transmitters 106-110 may be implemented in accordance with the embodiments of FIGS. 4-8. The RF transmitters 106-110 provide the outbound RF signals 112 to the transmit/receive module 114, which provides each outbound RF signal to a corresponding antenna 81-85.

When the radio 60 is in the receive mode, the transmit/receive module 114 receives one or more inbound RF signals 116 via the antennas 81-85 and provides them to one or more RF receivers 118-122. The RF receiver 118-122 converts the inbound RF signals 116 into a corresponding number of inbound symbol streams 124. The number of inbound symbol streams 124 will correspond to the particular mode in which the data was received. The baseband processing module 100 converts the inbound symbol streams 124 into inbound data 92, which is provided to the host device 18-32 via the host interface 62.

As one of average skill in the art will appreciate, the wireless communication device of FIG. 3 may be implemented using one or more integrated circuits. For example, the host device may be implemented on one integrated circuit, the baseband processing module 100 and memory 65 may be implemented on a second integrated circuit, and the remaining components of the radio 60, less the antennas 81-85, may be implemented on a third integrated circuit. As an alternate example, the radio 60 may be implemented on a single integrated circuit. As yet another example, the processing module 50 of the host device and the baseband processing module 100 may be a common processing device implemented on a single integrated circuit. Further, the memory 52 and memory 65 may be implemented on a single integrated circuit and/or on the same integrated circuit as the common processing modules of processing module 50 and the baseband processing module 100.

Figure 4:
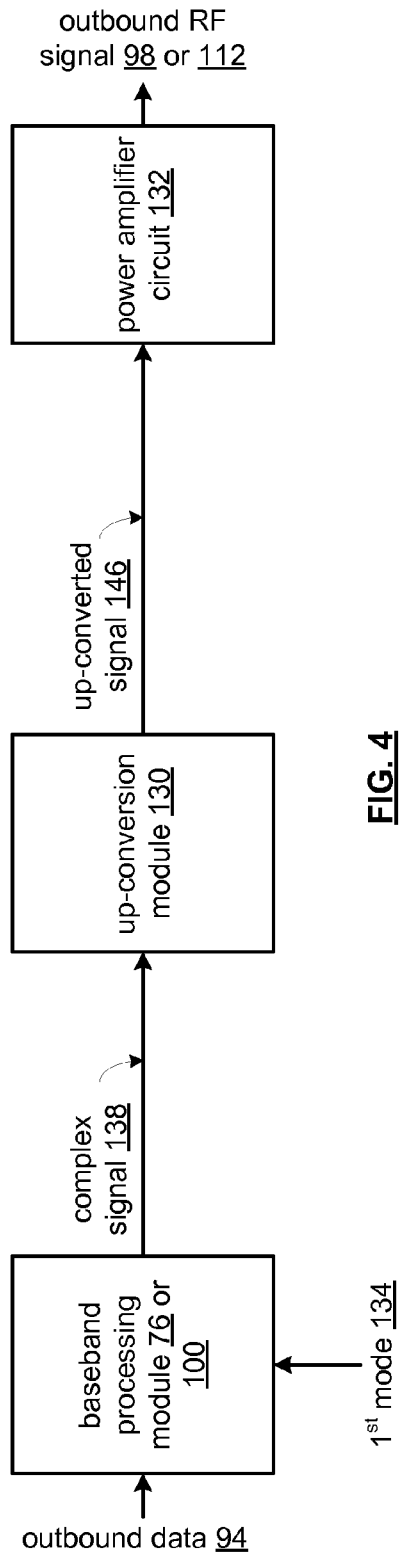
FIG. 4 is a schematic block diagram of an embodiment of a programmable hybrid transmitter in a first mode in accordance with the present invention.

FIG. 4 is a schematic block diagram of an embodiment of a programmable hybrid transmitter that includes a baseband processing module 76 or 100, an up-conversion module 130 and a power amplifier circuit 132 when the transmitter is in a first mode 134. In this mode, the baseband processing module 76 or 100 converts the outbound data 94 into a complex signal 138 (e.g., having a real component and an imaginary component). For example, the complex signal 138 may be an in-phase (I) component and a quadrature (Q) component of the outbound baseband symbols 96 and/or one of the outbound symbol streams 104.

The up-conversion module 130 mixes the complex signal 138 with a local oscillation (e.g., TX LO 83) to produce an up-converted signal 146. For example, if the complex signal 138 includes I and Q components, then the up-conversion module 130 mixes the I component of the complex signal 138 with an I component of the local oscillation to produce a first mixed signal and mixes the Q component of the complex signal 138 with a Q component of the local oscillation to produce a second mixed signal. The up-conversion module 130 sums the first and second mixed signals to produce the up-converted signal 146.

The power amplifier circuit 132, which may be one or more pre-amplifier stages and/or power amplifier stages, amplifies the up-converted signal 146 to produce an outbound RF signal 98 or 112. Note that in one embodiment the transmit power of the power amplifier circuit 132 may be adjusted in accordance with transmit property information 144.

Figure 5:
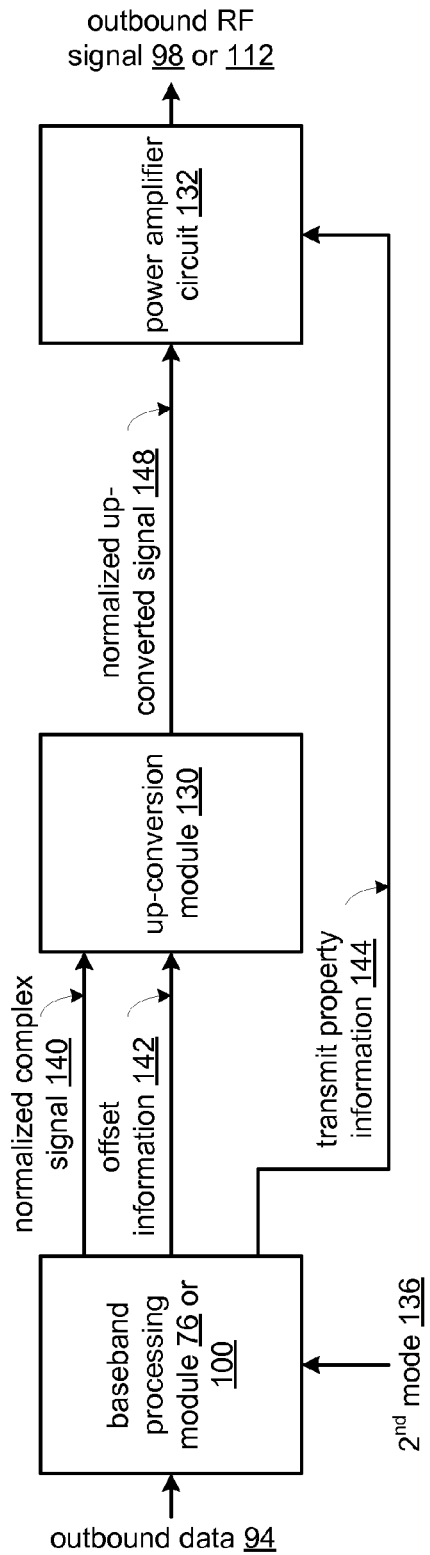
FIG. 5 is a schematic block diagram of an embodiment of a programmable hybrid transmitter in a second mode in accordance with the present invention.

FIG. 5 is a schematic block diagram of an embodiment of a programmable hybrid transmitter that includes a baseband processing module 76 or 100, an up-conversion module 130 and a power amplifier circuit 132 when the transmitter is in a second mode 134. In this mode, the baseband processing module 76 or 100 converts the outbound data 94 into a normalized complex signal 140, offset information 142, and transmit property information 144. The offset information 42 may include phase modulation data, frequency modulation data, frequency hopping data, and/or channel selection data. The transmit property information 144 may include amplitude modulation data and/or power control data.

The up-conversion module 130 mixes the normalized complex signal 140 (e.g., a complex signal having the amplitude of its real and imaginary components normalized to a desired value (e.g., 1)) with the local oscillation based on the offset information 142 to produce a normalized up-converted signal 148. For example, if the offset information 142 includes phase modulation data, the mixing of the normalized complex signal 140 and the local oscillation will be phase modulated based on the phase modulation data. As an alternate example, if the offset information 142 includes frequency modulation data, the mixing of the normalized complex signal 140 and the local oscillation will be frequency modulated based on the frequency modulation data.

The power amplifier circuit 132 amplifies the normalized up-converted signal 148 based on the transmit property information 144 to produce the outbound RF signal 98 or 112. For example, if the transmit property information includes amplitude modulation data, the power amplifier circuit 132 amplifies the normalized up-converted signal 148 in accordance with the amplitude modulation data to produce the outbound RF signal 98 or 112.

Figure 6:
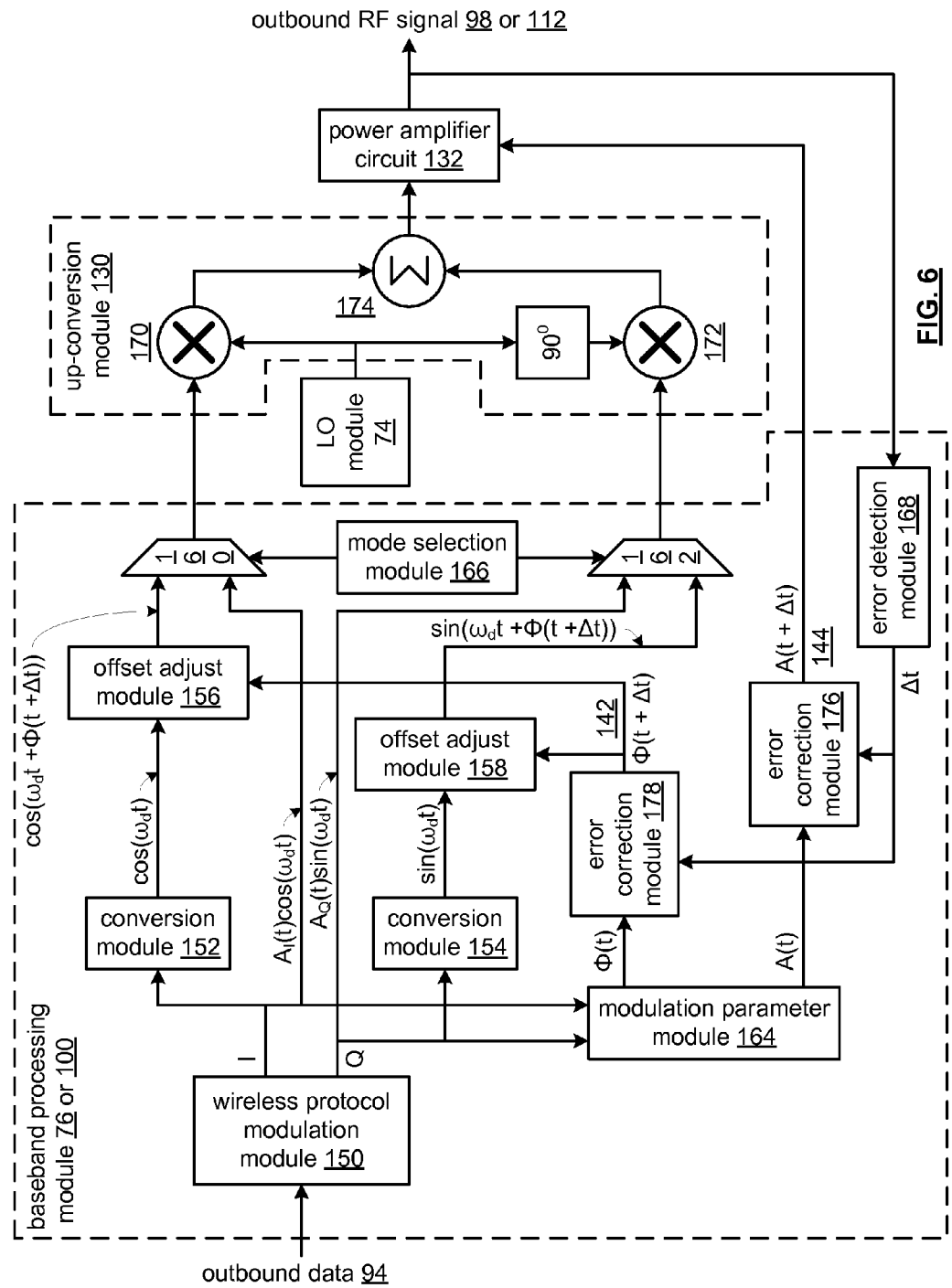
FIG. 6 is a schematic block diagram of an embodiment of a programmable hybrid transmitter in accordance with the present invention.

FIG. 6 is a schematic block diagram of an embodiment of a programmable hybrid transmitter that includes the baseband processing module 76 or 100, the up-conversion module 130 and the power amplifier circuit 132. In this embodiment, the baseband processing module 76 or 100 includes a wireless protocol modulation module 150, conversion modules 152 and 154, offset adjustment modules 156 and 158, multiplexers 160 and 162, a modulation parameter module 164, a mode selection module 166, an error detection module 168, and error correction modules 176 and 178. The up-conversion module 130 includes mixers 170 and 172, a summing module 174, and a ninety degree phase shift module 90°.

In operation, the wireless protocol modulation module 150 converts outbound data 94 in accordance with one or more wireless communication protocols to produce a complex signal having an I component an a Q component. The wireless communication protocol includes, but is not limited to, IEEE 802.11, Bluetooth, advanced mobile phone services (AMPS), digital AMPS, global system for mobile communications (GSM), code division multiple access (CDMA), local multipoint distribution systems (LMDS), multi-channel-multi-point distribution systems (MMDS), radio frequency identification (RFID), and/or variations thereof.

The I component may be expressed as $A_I(t)\cos(\omega_{d_n}t)$ where $A_I(t)$ represents the amplitude of the I component and $\omega_{d_n}$ represent the radian of the data, and the Q component may be expressed as $A_Q(t)\sin(\omega_{d_n}t)$ where $A_Q(t)$ represents the amplitude of the Q component. For example, $\omega_{d_n}$ may correspond to the frequency of a subcarrier of an OFDM (orthogonal frequency division multiplexed) signal, where n represents the number of the subcarrier. Further, the OFDM signal may include a 20 MHz wide channel consisting of 64 subcarrier frequencies, where the subcarriers are frequency spaced by 312.5 KHz. Thus, for subcarrier number 10, $\omega_{d_{10}}$ represents $2*\pi*10*312.5$ KHz.

The I component is provided to the conversion module 152, to the modulation parameter module 164, and to multiplexer 160 and the Q component is provided to the conversion module 154, to the modulation parameter module 164, and to multiplexer 162. The conversion modules 152 and 154 normalize the magnitude their corresponding inputs to produce a normalized I component and a normalized Q component, respectively. The normalized magnitude may be to any desired value and, in one embodiment, is one. By normalizing the magnitudes to one, the normalized I component may be expressed as $\cos(\omega_{dn}t)$ and the normalized Q component may be expressed as $\sin(\omega_{dn}t)$.

The modulation module 164 is couple to generate offset information 142 and transmit property information 144 based on the I and Q components. In one embodiment, the modulation module 164 generates phase modulation data ($\Phi(t)$) as the offset information 142 and generates amplitude modulation data ($A(t)$) as the transmit property information 144 from the I and Q components. For example, the phase modulation data may be derived based on $\tan^{-1}(A_Q/A_I)$ and the amplitude modulation data may be derived based on the square root of $(A_I^2+A_Q^2)$.

Error correction module 178 corrects the phase modulation data ($\Phi(t)$) based on a phase error ($\Delta(t)$) to produce corrected phase modulated data ($\Phi(t+\Delta(t))$) (e.g., offset information 142) and error correction module 176 corrects the amplitude modulation data ($A(t)$) based on the phase error ($\Delta(t)$) to produce corrected amplitude modulated data ($A(t+\Delta(t))$) (e.g., transmit property information 144).

Offset module 156 adjusts the normalized I component (e.g., $\cos(\omega_{dn}t)$) based on the offset information 142 (e.g., $\Phi(t+\Delta(t))$) to produce an offset adjusted normalized I component (e.g., $\cos(\omega_{dn}t+\Phi(t+\Delta(t)))$). Offset module 158 adjusts the normalized Q component (e.g., $\sin(\omega_{dn}t)$) based on the offset information 142 (e.g., $\Phi(t+\Delta(t))$) to produce an offset adjusted normalized Q component (e.g., $\sin(\omega_{dn}t+\Phi(t+\Delta(t)))$).

When the transmitter is in the first mode, the I and Q components of the complex signal (e.g., $A_I(t)\cos(\omega_{dn}t)$ and $A_Q(t)\sin(\omega_{dn}t)$) are provided to the up-conversion module 130. The first mixer 170 mixes the I component (e.g., $A_I(t)\cos(\omega_{dn}t)$) with an I component of the local oscillation (e.g., $\cos(\omega_{RF}(t))$) to produce a first mixed signal (e.g., $\tfrac{1}{2} A_I(t)*[\cos((\omega_{RF}-\omega_{dn})(t))+\cos((\omega_{RF}+\omega_{dn})(t))]$). The second mixer 172 mixes the Q component (e.g., $A_Q(t)\sin(\omega_{dn}t)$) with an Q component of the local oscillation (e.g., $\sin(\omega_{RF}(t))$) to produce a second mixed signal (e.g., $\tfrac{1}{2} A_Q(t)*[\cos((\omega_{RF}-\omega_{dn})(t))-\cos((\omega_{RF}+\omega_{dn})(t))]$). The summing module 174 combines the first and second mixed signals to yield $\tfrac{1}{2}(A_I(t)+A_Q(t))\cos((\omega_{RF}+\omega_{dn})(t))$.

When the transmitter is in the second mode, offset adjusted normalized I and Q components (e.g., $\cos(\omega_{dn}t+\Phi(t+\Delta(t)))$ and $\sin(\omega_{dn}t+\Phi(t+\Delta(t)))$) are provided to the up-conversion module 130. The first mixer 170 mixes the offset adjusted normalized I component with the I component of the local oscillation (e.g., $\cos(\omega_{RF}(t))$) to produce a first mixed signal (e.g., $\tfrac{1}{2}\cos(\omega_{RF}t-\omega_{dn}t-\Phi(t+\Delta(t)))+\tfrac{1}{2}\cos(\omega_{RF}t+\omega_{dn}t+\Phi(t+\Delta(t)))$). The second mixer 172 mixes the offset adjusted normalized Q component with the Q component of the local oscillation (e.g., $\sin(\omega_{RF}(t))$) to produce a first mixed signal (e.g., $\tfrac{1}{2}\cos(\omega_{RF}t-\omega_{dn}t-\Phi(t+\Delta(t)))-\tfrac{1}{2}\cos(\omega_{RF}t+\omega_{dn}t+\Phi(t+\Delta(t)))$). The summing module 174 combines the first and second mixed signals to yield the normalized up-converted signal 148 (e.g., $\cos(\omega_{RF}t+\omega_{dn}t+\Phi(t+\Delta(t)))$). The power amplifier amplifies the normalized up-converted signal 148 based on the transmit property information 144 (e.g., $A(t+\Delta(t))$) to yield the RF signal 98 or 112 (e.g., $A(t+\Delta(t))\cos(\omega_{RF}t+\omega_{dn}t+\Phi(t+\Delta(t)))$). When the phase error (e.g., $\Delta(t)$) is properly set, $A(t+\Delta(t))\cos(\omega_{RF}t+\omega_{dn}t+\Phi(t+\Delta(t)))$ should equal $\tfrac{1}{2}(A_I(t)+A_Q(t))\cos((\omega_{RF}+\omega_{dn})(t))$.

The error detection module 168 generates the phase error ($\Delta(t)$) based on a difference between the up-converted signal and the normalized up-converted signal. For example, the difference may be based on a difference between the processing times to produce the outbound RF signal when the transmitter is in the first mode and when the transmitter is in the second mode. In one embodiment, the phase error may be determined by generating a test complex signal by the baseband processing module 76 or 100. With the transmitter in the first mode, the test complex signal (e.g., a test I component and a test Q component) is provided to the up-conversion module 130. The up-conversion module 130 mixes the test complex signal with the local oscillation to produce a test up-converted signal, which is amplified by the power amplifier circuit 132 to produce a test RF signal. The error detection module 168 measures a property of a test RF signal, where the property may be amplitude, phase, and/or frequency of the test RF signal.

The determination of the phase error continues with the baseband processing module 76 or 100 generating a test normalized complex signal, test offset information, and test transmit property information. This may be done by first generating the test complex signal as described above. With the transmitter in the second mode the test complex signal is normalized via the conversion modules 152 and 154 to produce the test normalized complex signal. In addition, the modulation parameter module 164 generates the test offset information and test transmit property information based on the test complex signal.

The determination of the phase error continues with error detection module 168 measuring a corresponding property (e.g., amplitude, phase, and/or frequency) of a second test RF signal. The error detection module 168 then compares the property of the test RF signal to the corresponding property of the second test RF signal. The error detection module 168 then generates the phase error based on the comparing the property to the corresponding property. For instance, the error detection module 168 may adjust the phase error until the second test RF signal (e.g., $A(t+\Delta(t))\cos(\omega_{RF}t+\omega_{dn}t+\Phi(t+\Delta(t)))$) equals the test RF signal (e.g., $\tfrac{1}{2}(A_I(t)+A_Q(t))\cos((\omega_{RF}+\omega_{dn})(t))$).

In another embodiment for determining the phase error, the conversion modules 152 and 154 may normalize the amplitude of the I and Q components to A1(t). In addition, the modulation parameter module 164 may set the transmit property information to an amplitude of A2(t), where A1(t) equals A2(t). Based on these settings, the resulting RF signal should be $A(t)\cos((\omega_{RF}+\omega_{dn}(t)))$, where $A(t)=A1(t)*A2(t)$. With A1(t)=A2(t), then $A(t)=A1(t)^2$ when the phase error is properly set. Thus, the error detection module 168 adjusts the phase error $\Delta(t)$ until $A(t)$ substantially equals $A1(t)^2$.

In another embodiment for determining phase error, the error detection module 168 may measure the envelope of the outbound RF signal when in the second mode and the above A1 and A2 parameters are used. The error detection module 168 determines the phase error by adjusting it until the envelope is at a desired level.

In transceiver where the receive path and transmit path uses different frequencies, the phase error may be determined by providing test signals between the receive path and the transmit path in a feed-through manner. For instance, the outbound RF test signals may be provided to the receive path and down-converted to IF or baseband signals. The received IF or baseband test signals are compared with the generated test signals by the transmit path to determine the phase error.

With a proper setting for the phase error, the transmitter can smoothly switch between the first mode and the second mode as determined by the mode selection module 168. In one embodiment, the mode selection module 168 may select the first or second mode by monitoring an operational parameter (e.g., power level, peak to average power, power amplifier 1 dB compression point, user controllable input, and/or wireless protocol modulation specification of the programmable hybrid transmitter (e.g., Cartesian coordinates or Polar coordinates)). When the operational parameter compares favorably with an operational threshold (e.g., a desired power level, etc), the mode selection module 168 places the programmable hybrid transmitter in the first mode and when the operational parameter compares unfavorably with the operational threshold, the mode selection module 168 places the programmable hybrid transmitter in the second mode.

Figure 7:
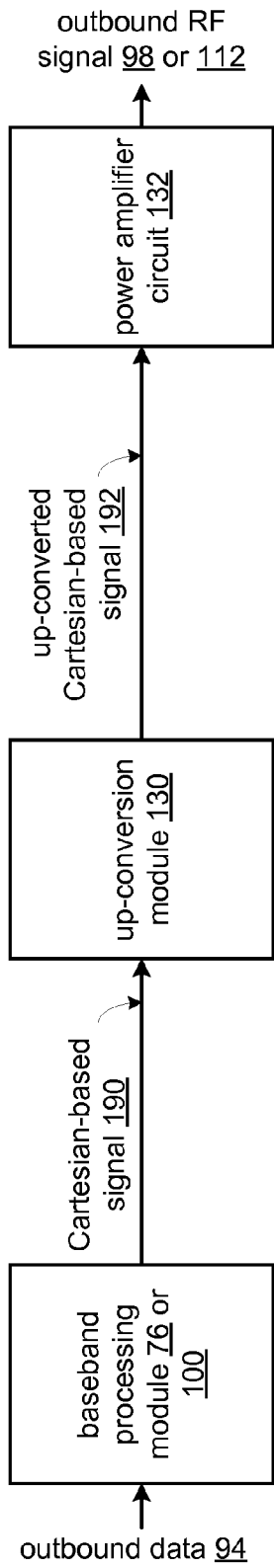
FIG. 7 is a schematic block diagram of another embodiment of a programmable hybrid transmitter in a first mode in accordance with the present invention.

FIG. 7 is a schematic block diagram of an embodiment of a programmable hybrid transmitter that includes a baseband processing module 76 or 100, an up-conversion module 130 and a power amplifier circuit 132 when the transmitter is in a first mode 134. In this mode, the baseband processing module 76 or 100 converts the outbound data 94 into a Cartesian-based signal 190 (e.g., having an I component and an Q component).

The up-conversion module 130 mixes the Cartesian-based signal 190 with a local oscillation (e.g., TX LO 83) to produce an up-converted Cartesian-based signal 192. For example, the up-conversion module 130 mixes the I component with an I component of the local oscillation to produce a first mixed signal and mixes the Q component with a Q component of the local oscillation to produce a second mixed signal. The up-conversion module 130 sums the first and second mixed signals to produce the up-converted Cartesian-based signal 192.

The power amplifier circuit 132, which may be one or more pre-amplifier stages and/or power amplifier stages, amplifies the up-converted Cartesian-based signal 192 to produce an outbound RF signal 98 or 112. Note that in one embodiment the transmit power of the power amplifier circuit 132 may be adjusted in accordance with transmit property information 144.

Figure 8:
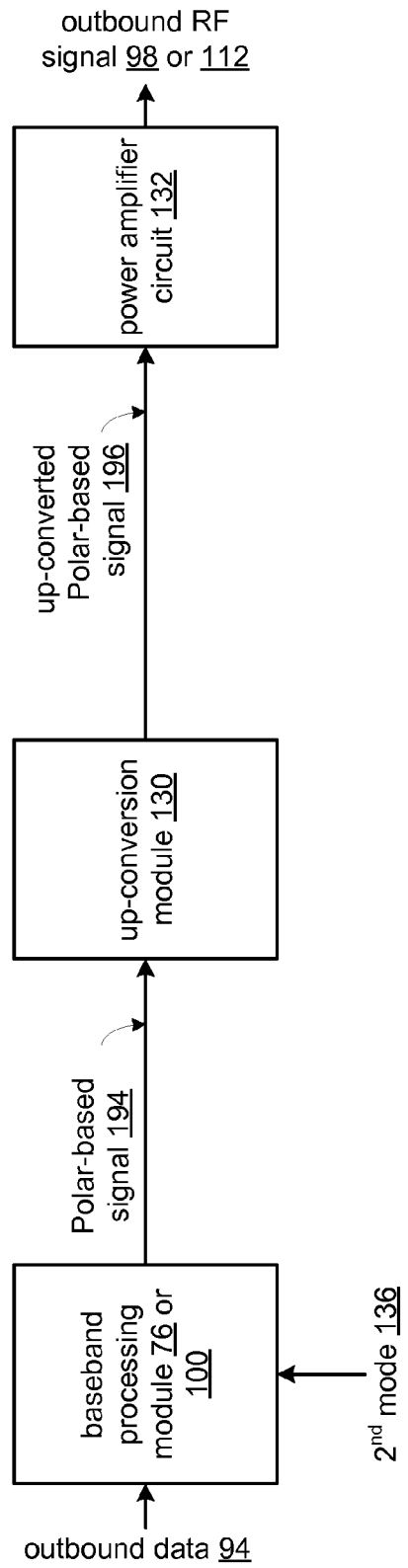
FIG. 8 is a schematic block diagram of another embodiment of a programmable hybrid transmitter in a second mode in accordance with the present invention.

FIG. 8 is a schematic block diagram of an embodiment of a programmable hybrid transmitter that includes a baseband processing module 76 or 100, an up-conversion module 130 and a power amplifier circuit 132 when the transmitter is in a second mode 134. In this mode, the baseband processing module 76 or 100 converts the outbound data 94 into a Polar-based signal 194 (e.g., a vector having a magnitude and phase angle such as A $\cos(\omega_{dn}(t)+\Phi(t))$).

The up-conversion module 130 mixes the Polar-based signal 194 with a local oscillation (e.g., TX LO 83) to produce an up-converted Polar-based signal 196. The power amplifier circuit 132, which may be one or more pre-amplifier stages and/or power amplifier stages, amplifies the up-converted Polar-based signal 192 to produce an outbound RF signal 98 or 112.

Figure 9:
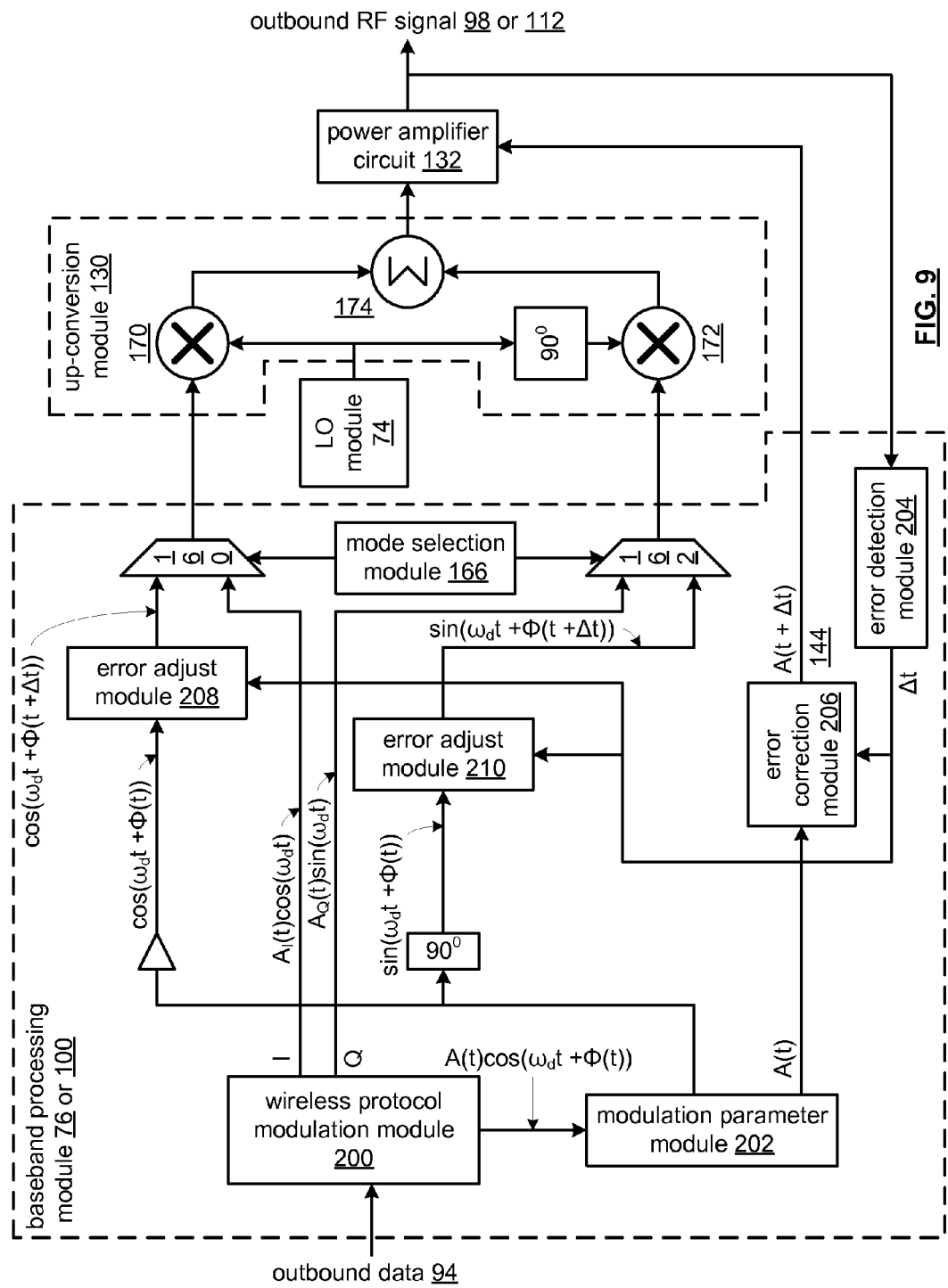
FIG. 9 is a schematic block diagram of another embodiment of a programmable hybrid transmitter in accordance with the present invention.

FIG. 9 is a schematic block diagram of another embodiment of a programmable hybrid transmitter that includes the baseband processing module 76 or 100, the up-conversion module 130 and the power amplifier circuit 132. In this embodiment, the baseband processing module 76 or 100 includes a wireless protocol modulation module 200, error adjustment modules 208 and 210, the multiplexers 160 and 162, a modulation parameter module 202, the mode selection module 166, an error detection module 204, an error correction module 206 and a ninety degree phase shift module 90°.

When the transmitter is in the first mode, the wireless protocol converter 200 converts the outbound data 94 into a Cartesian-based signal 190, which includes an I component (e.g., $A_I(t)\cos(\omega_{dn}t)$) and a Q component (e.g., $A_Q(t)\sin(\omega_{dn}t)$). The up-conversion module 130 mixes the I and Q components with the local oscillation as previously discussed to produce the up-converted Cartesian-based signal 192 and the power amplifier circuit 132 amplifies the up-converted Cartesian-based signal 192 to produce the outbound RF signal (e.g., ½ $(A_I(t)+A_Q(t))\cos((\omega_{RF}+\omega_{dn})(t))$).

When the transmitter is in the second mode, the wireless protocol converter 200 converts the outbound data 94 into a Polar-based signal 194 (e.g., $A(t)\cos(\omega_{dn}(t)+\Phi(t))$). The modulation parameter module 202 converts the Polar-based signal 194 into a normalized real component (e.g., $\cos(\omega_{dn}(t)+\Phi(t))$) and amplitude modulation data (e.g., A(t)). The ninety degree phase shift module generates a normalized imaginary component (e.g., $\sin(\omega_{dn}(t)+\Phi(t))$) from the normalized real component.

Error adjust module 208 adjusts the normalized real component (e.g., $\cos(\omega_{dn}(t)+\Phi(t))$) based on the phase error (e.g. $\Delta(t)$) to produce an error compensated normalized real component (e.g., $\cos(\omega_{dn}(t)+\Phi(t+\Delta(t)))$) and error adjust module 210 adjusts the normalized imaginary component (e.g., $\sin(\omega_{dn}(t)+\Phi(t))$) based on the phase error (e.g. $\Delta(t)$) to produce an error compensated normalized imaginary component (e.g., $\sin(\omega_{dn}(t)+\Phi(t+\Delta(t)))$).

The up-conversion module mixes the error compensated normalized real and imaginary components to produce the up-converted Polar-based signal 196 (e.g., $\cos(\omega_{RF}t+\omega_{dn}t+\Phi(t+\Delta(t)))$). The power amplifier circuit 132 amplifies the normalized up-converted Polar-based signal 196 based on the transmit property information 144 (e.g., $A(t+\Delta(t))$) to yield the RF signal 98 or 112 (e.g., $A(t+\Delta(t))\cos(\omega_{RF}t+\omega_{dn}t+\Phi(t+\Delta(t)))$). When the phase error (e.g., $\Delta(t)$) is properly set, $A(t+\Delta(t))\cos(\omega_{RF}t+\omega_{dn}t+\Phi(t+\Delta(t)))$ should equal ½ $(A_I(t)+A_Q(t))\cos((\omega_{RF}+\omega_{dn})(t))$.

The error detection module 204 may determine the phase error in a variety of ways. In one embodiment, the error detection module 204 generates the phase error ($\Delta(t)$) based on a difference between the up-converted Cartesian-based signal and the up-converted Polar-based signal. For example, the difference may be based on a difference between the processing times to produce the outbound RF signal when the transmitter is in the first mode and when the transmitter is in the second mode. In one embodiment, the phase error may be determined by generating a test Cartesian-based signal by the baseband processing module 76 or 100. With the transmitter in the first mode, the test Cartesian-based signal (e.g., a test I component and a test Q component) is provided to the up-conversion module 130. The up-conversion module 130 mixes the test Cartesian-based signal with the local oscillation to produce a test up-converted Cartesian-based signal, which is amplified by the power amplifier circuit 132 to produce a test RF signal. The error detection module 204 measures a property of a test RF signal, where the property may be amplitude, phase, and/or frequency of the test RF signal.

The determination of the phase error continues with the baseband processing module 76 or 100 generating a test Polar-based signal. With the transmitter in the second mode, the modulation parameter module 202 converts the test Polar-based signal into a normalized test Polar-based signal and amplitude modulation data, which are subsequently converted into a second test RF signal.

The determination of the phase error continues with error detection module 204 measuring a corresponding property (e.g., amplitude, phase, and/or frequency) of a second test RF signal. The error detection module 204 then compares the property of the test RF signal to the corresponding property of the second test RF signal. The error detection module 204 then generates the phase error based on the comparing the property to the corresponding property. For instance, the error detection module 204 may adjust the phase error until the second test RF signal (e.g., $A(t+\Delta(t)) \cos(\omega_{RF}t+\omega_{dn}t+\Phi(t+\Delta(t))))$ equals the test RF signal (e.g., $\frac{1}{2}(A_I(t)+A_Q(t)) \cos((\omega_{RF}+\omega_{dn})(t)))$.

In another embodiment for determining the phase error, the modulation parameter module 202 normalizes the amplitude of the Polar-based signal to A1(t) and sets the transmit property information to an amplitude of A2(t), where A1(t) equals A2(t). Based on these settings, the resulting RF signal should be $A(t)\cos((\omega_{RF}+\omega_{dn})(t)))$, where A(t)=A1(t)*A2(t). With A1(t)=A2(t), then A(t)=A1(t)$^2$ when the phase error is properly set. Thus, the error detection module 204 adjusts the phase error $\Delta(t)$ until A(t) substantially equals A1(t)$^2$.

In another embodiment for determining phase error, the error detection module 204 may measure the envelope of the outbound RF signal when in the second mode and the above A1 and A2 parameters are used. The error detection module 204 determines the phase error by adjusting it until the envelope is at a desired level.

Figure 10:
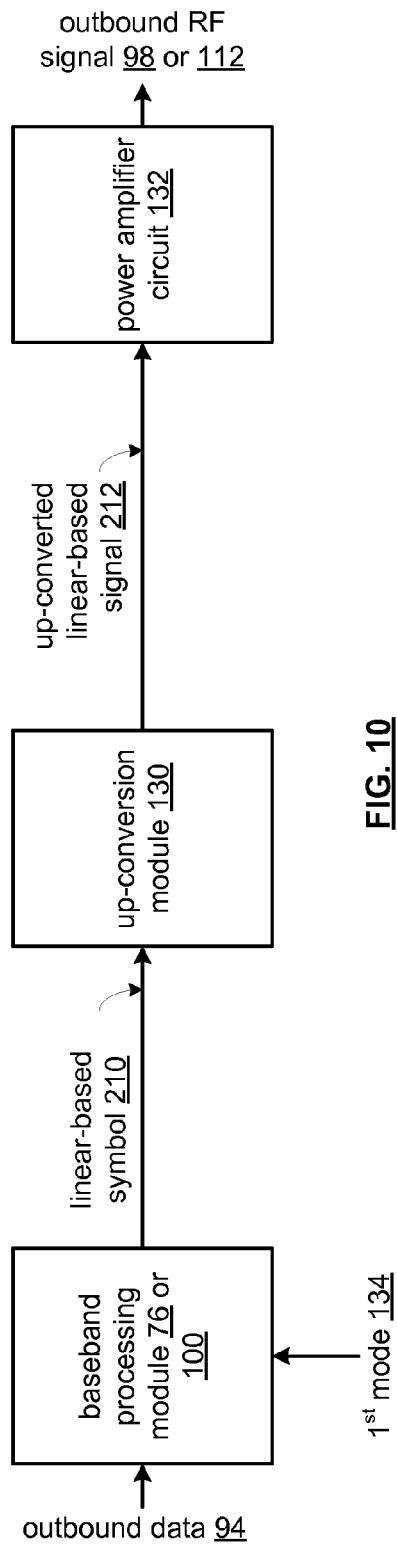
FIG. 10 is a schematic block diagram of another embodiment of a programmable hybrid transmitter in a first mode in accordance with the present invention.

FIG. 10 is a schematic block diagram of an embodiment of a programmable hybrid transmitter that includes a baseband processing module 76 or 100, an up-conversion module 130 and a power amplifier circuit 132 when the transmitter is in a first mode 134. In this mode, the baseband processing module 76 or 100 converts the outbound data 94 into a linear-based signal 210. For instance, a linear-based signal 210 is one that has data represented in such a way that the up-conversion module and the power amplifier circuit need to be linear to prevent data degradation. For example, a linear-based signal may have an I component and an Q component.

The up-conversion module 130 mixes the linear-based signal 210 with a local oscillation (e.g., TX LO 83) to produce an up-converted linear-based signal 212. The power amplifier circuit 132, which may be one or more pre-amplifier stages and/or power amplifier stages, amplifies the up-converted linear-based signal 212 to produce an outbound RF signal 98 or 112. Note that in one embodiment the transmit power of the power amplifier circuit 132 may be adjusted in accordance with transmit property information 144.

Figure 11:
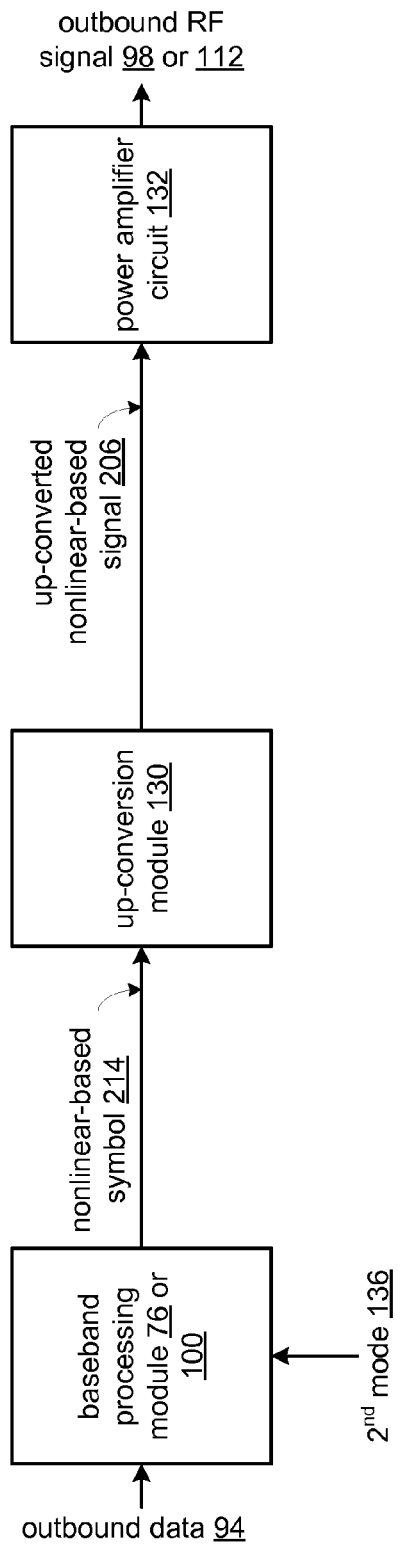
FIG. 11 is a schematic block diagram of another embodiment of a programmable hybrid transmitter in a second mode in accordance with the present invention.

FIG. 11 is a schematic block diagram of an embodiment of a programmable hybrid transmitter that includes a baseband processing module 76 or 100, an up-conversion module 130 and a power amplifier circuit 132 when the transmitter is in a second mode 134. In this mode, the baseband processing module 76 or 100 converts the outbound data 94 into a non-linear-based signal 214. For instance, a nonlinear-based signal 214 is one that has data represented in such a way that the up-conversion module and the power amplifier circuit do not need to be linear to prevent data degradation. For example, a nonlinear-based signal may be a vector having magnitude and phase angle components, such as $A \cos(\omega_{dn}(t)+\Phi(t))$.

The up-conversion module 130 mixes the nonlinear-based signal 214 with a local oscillation (e.g., TX LO 83) to produce an up-converted nonlinear-based signal 216. The power amplifier circuit 132, which may be one or more pre-amplifier stages and/or power amplifier stages, amplifies the up-converted Polar-based signal 192 to produce an outbound RF signal 98 or 112.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "coupled to" and/or "coupling" and/ or includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" indicates that an item includes one or more of power connections, input(s), output (s), etc., to perform one or more its corresponding functions and may further include inferred coupling to one or more other items. As may still further be used herein, the term "associated with", includes direct and/or indirect coupling of separate items and/or one item being embedded within another item. As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The present invention has also been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention.

The present invention has been described above with the aid of functional building blocks illustrating the performance of certain significant functions. The boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

What is claimed is:

1. A programmable hybrid transmit baseband module comprises:
   a wireless protocol conversion module operable to convert outbound data into a complex signal having an in-phase (I) signal component and a quadrature (Q) signal component;
   a set of modules operable to generate an offset adjusted normalized I signal component, an offset adjusted normalized Q signal component, and corrected amplitude modulation data, wherein each of the offset adjusted normalized I and Q signal components includes phase modulation data, wherein the set of modules comprises:
a modulation parameter module operable to generate amplitude modulation data and the phase modulation data from the I and Q signals components;
an I conversion module operable to convert the I signal component into a normalized I signal component;
a Q conversion module operable to convert the Q signal component into a normalized Q signal component;
an I offset adjust module operable to convert the normalized I signal component into the offset adjusted normalized I signal component based on corrected phase modulated data;
a Q offset adjust module operable to convert the normalized Q signal component into the offset adjusted normalized Q signal component based on the corrected phase modulated data;
a phase error correction module operable to generate the corrected phase modulation data from the phase modulation data and a phase error;
an amplitude error correction module operable to generate the corrected amplitude modulation data from the amplitude modulation data and the phase error; and
an error detection module operable to generate the phase error based on a difference between the first mode and the second mode; and
a mode selection module operable to:
output the I and Q signal components when the programmable hybrid transmit baseband module is in a first mode; and
output the offset adjusted normalized I and Q signal components and the corrected amplitude modulation data when the programmable hybrid transmit baseband module is in a second mode.

2. The programmable hybrid transmit baseband module of claim 1, wherein the error detection module further functions to:
determine a phase error between an up-converted signal and a normalized up-converted signal, wherein the up-converted signal corresponds to the I and Q signal components being up-converted and the normalized up-converted signal corresponds to the offset adjusted normalized I and Q signal components being up-converted.

3. The programmable hybrid transmit baseband module of claim 1, wherein the error detection module further functions to:
measure a property of a test RF signal, wherein the test RF signal is generated from a test complex signal;
measure a corresponding property of a second test RF signal, wherein the second test RF signal is generated from a test normalized complex signal, test offset information, and test transmit property information;
compare the property to the corresponding property; and
generate the phase error based on the comparing the property to the corresponding property.

4. The programmable hybrid transmit baseband module of claim 1, wherein the error detection module further functions to:
measure an envelope of the outbound RF signal; and
determine the phase error from the envelope.

5. The programmable hybrid transmit baseband module of claim 1, wherein the mode select module further functions to:
monitor an operational parameter of an outbound radio frequency (RF) signal;

when the operational parameter compares favorably with an operational threshold, place the programmable hybrid transmitter in the first mode; and
when the operational parameter compares unfavorably with the operational threshold, place the programmable hybrid transmitter in the second mode.

6. The programmable hybrid transmit baseband module of claim 5, wherein the operational parameter includes at least one of:
power level;
peak to average power;
power amplifier 1 dB compression point;
user controllable input; and
wireless protocol modulation specification.

7. A programmable hybrid transmit baseband module comprises:
a wireless protocol conversion module operable to convert outbound data into a complex signal having an in-phase (I) signal component and a quadrature (Q) signal component;
a set of modules operable to generate an offset adjusted normalized I signal component, an offset adjusted normalized Q signal component, and corrected amplitude modulation data, wherein each of the offset adjusted normalized I and Q signal components includes phase modulation data, wherein the set of modules comprises:
a modulation parameter module operable to generate a normalized real component and amplitude modulation data from a polar based signal representative of the complex signal;
a ninety degree phase shift module operable to generate a normalized imaginary component from the normalized real component;
a real component error adjust module operable to adjust the normalized real component based on a phase error to produce an error compensated normalized real component;
an imaginary component error adjust module operable to adjust the normalized imaginary component based on the phase error to produce an error compensated normalized imaginary component;
an amplitude error correction module operable to generate the corrected amplitude modulation data from the amplitude modulation data and the phase error; and
an error detection module operable to generate the phase error based on a difference between the first mode and the second mode: and
a mode selection module operable to:
output the I and Q signal components when the programmable hybrid transmit baseband module is in a first mode; and
output the offset adjusted normalized I and Q signal components and the corrected amplitude modulation data when the programmable hybrid transmit baseband module is in a second mode.

8. A programmable hybrid transmit baseband module comprises:
a wireless protocol conversion module operable to convert outbound data into a complex signal having an in-phase (I) signal component and a quadrature (Q) signal component;
a set of modules operable to generate an offset adjusted normalized I signal component, an offset adjusted normalized Q signal component, and corrected amplitude modulation data, wherein each of the offset adjusted normalized I and Q signal components includes phase modulation data, wherein the set of modules comprises:
a modulation parameter module operable to generate the amplitude modulation data and the phase modulation data from the I and Q signals components;
an I conversion module operable to convert the I signal component into a normalized I signal component;
a Q conversion module operable to convert the Q signal component into a normalized Q signal component;
an I offset adjust module operable to convert the normalized I signal component into the offset adjusted normalized I signal component based on corrected phase modulated data;
a Q offset adjust module operable to convert the normalized Q signal component into the offset adjusted normalized Q signal component based on the corrected phase modulated data; and
a mode selection module operable to:
output the I and Q signal components when the programmable hybrid transmit baseband module is in a first mode; and
output the offset adjusted normalized I and Q signal components and the corrected amplitude modulation data when the programmable hybrid transmit baseband module is in a second mode.

9. The programmable hybrid transmit baseband module of claim 8, wherein the set of modules further comprises:
a phase error correction module operable to generate the corrected phase modulation data from the phase modulation data and a phase error;
an amplitude error correction module operable to generate the corrected amplitude modulation data from the amplitude modulation data and the phase error; and
an error detection module operable to generate the phase error based on a difference between the first mode and the second mode.

10. The programmable hybrid transmit baseband module of claim 9, wherein the error detection module further functions to:
determine a phase error between an up-converted signal and a normalized up-converted signal, wherein the up-converted signal corresponds to the I and Q signal components being up-converted and the normalized up-converted signal corresponds to the offset adjusted normalized I and Q signal components being up-converted.

11. The programmable hybrid transmit baseband module of claim 9, wherein the error detection module further functions to:
measure a property of a test RF signal, wherein the test RF signal is generated from a test complex signal;
measure a corresponding property of a second test RF signal, wherein the second test RF signal is generated from a test normalized complex signal, test offset information, and test transmit property information;
compare the property to the corresponding property; and
generate the phase error based on the comparing the property to the corresponding property.

12. The programmable hybrid transmit baseband module of claim 9, wherein the error detection module further functions to:
measure an envelope of the outbound RF signal; and
determine the phase error from the envelope.

13. The programmable hybrid transmit baseband module of claim 8, wherein the mode select module further functions to:

monitor an operational parameter of an outbound radio frequency (RF) signal;
when the operational parameter compares favorably with an operational threshold, place the programmable hybrid transmitter in the first mode; and
when the operational parameter compares unfavorably with the operational threshold, place the programmable hybrid transmitter in the second mode.

14. The programmable hybrid transmit baseband module of claim 13, wherein the operational parameter includes at least one of: power level; peak to average power; power amplifier 1 dB compression point; user controllable input; and wireless protocol modulation specification.

15. A programmable hybrid transmit baseband module comprises:
a wireless protocol conversion module operable to convert outbound data into a complex signal having an in-phase (I) signal component and a quadrature (Q) signal component;
a set of modules operable to generate an offset adjusted normalized I signal component, an offset adjusted normalized Q signal component, and corrected amplitude modulation data, wherein each of the offset adjusted normalized I and Q signal components includes phase modulation data, wherein the set of modules comprises:
a modulation parameter module operable to generate a normalized real component and the amplitude modulation data from a polar based signal representative of the complex signal;
a ninety degree phase shift module operable to generate a normalized imaginary component from the normalized real component;
a real component error adjust module operable to adjust the normalized real component based on a phase error to produce an error compensated normalized real component;
an imaginary component error adjust module operable to adjust the normalized imaginary component based on the phase error to produce an error compensated normalized imaginary component; and
a mode selection module operable to:
output the I and Q signal components when the programmable hybrid transmit baseband module is in a first mode; and
output the offset adjusted normalized I and Q signal components and the corrected amplitude modulation data when the programmable hybrid transmit baseband module is in a second mode.

16. The programmable hybrid transmit baseband module of claim 15, wherein the set of modules further comprises:
an amplitude error correction module operable to generate the corrected amplitude modulation data from the amplitude modulation data and the phase error; and
an error detection module operable to generate the phase error based on a difference between the first mode and the second mode.

17. The programmable hybrid transmit baseband module of claim 16, wherein the error detection module further functions to:
determine a phase error between an up-converted signal and a normalized up-converted signal, wherein the up-converted signal corresponds to the I and Q signal components being up-converted and the normalized up-converted signal corresponds to the offset adjusted normalized I and Q signal components being up-converted.

18. The programmable hybrid transmit baseband module of claim 16, wherein the error detection module further functions to:
- measure a property of a test RF signal, wherein the test RF signal is generated from a test complex signal;
- measure a corresponding property of a second test RF signal, wherein the second test RF signal is generated from a test normalized complex signal, test offset information, and test transmit property information;
- compare the property to the corresponding property; and
- generate the phase error based on the comparing the property to the corresponding property.

19. The programmable hybrid transmit baseband module of claim 15, wherein the mode select module further functions to:
- monitor an operational parameter of an outbound radio frequency (RF) signal;
- when the operational parameter compares favorably with an operational threshold, place the programmable hybrid transmitter in the first mode; and
- when the operational parameter compares unfavorably with the operational threshold, place the programmable hybrid transmitter in the second mode.

20. The programmable hybrid transmit baseband module of claim 19, wherein the operational parameter includes at least one of: power level; peak to average power; power amplifier 1 dB compression point; user controllable input; and wireless protocol modulation specification.

* * * * *